DETECTOR AND AGC CIRCUIT STABILIZATION RESPONSIVE TO POWER SUPPLY CHANGES
Filed Nov. 29, 1965
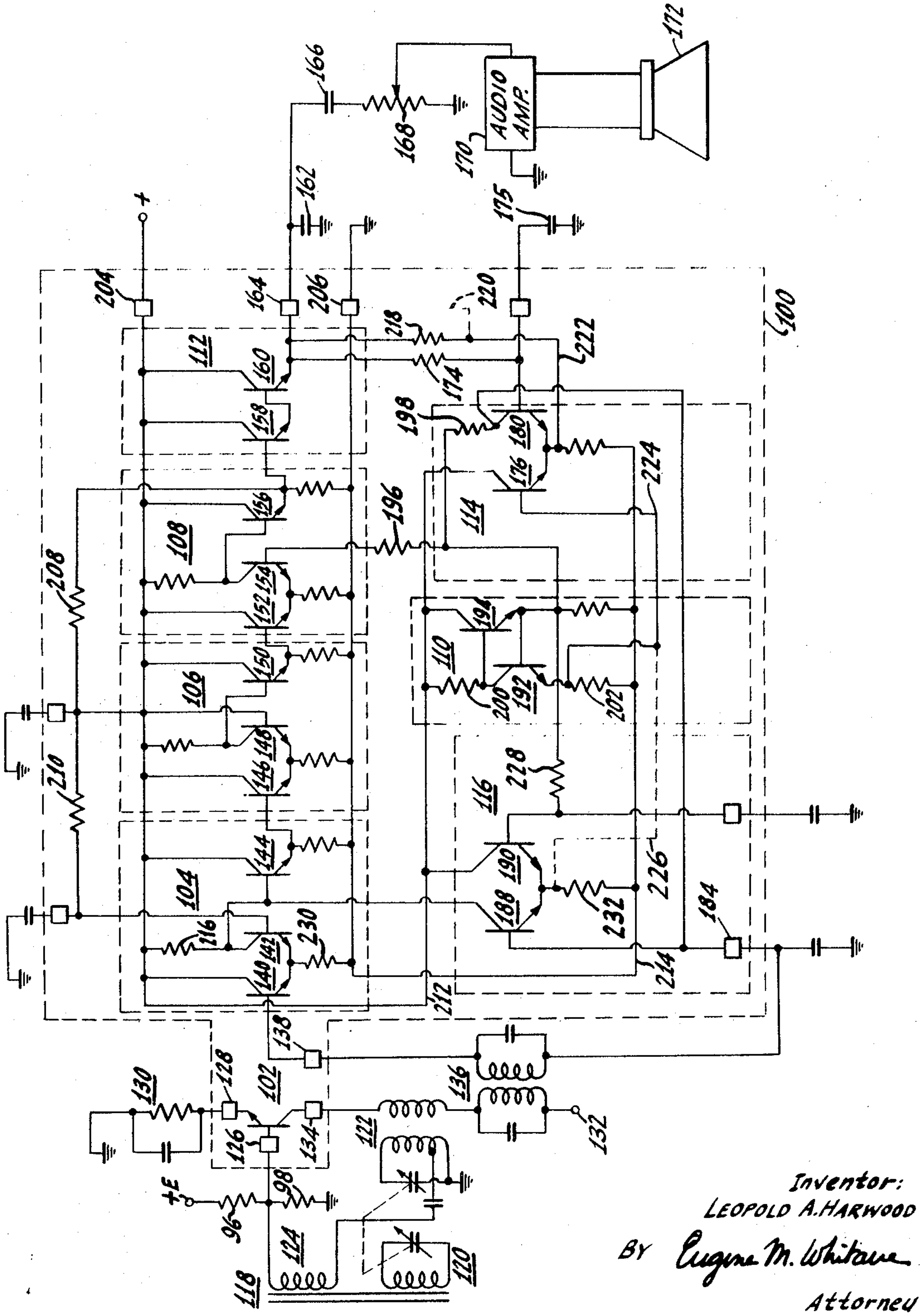
Inventor:
LEOPOLD A. HARWOOD
BY Eugene M. Whitacre
Attorney United States Patent Office 3,469,195
Patented Sept. 23, 1969

3,469,195

DETECTOR AND AGC CIRCUIT STABILIZATION RESPONSIVE TO POWER SUPPLY CHANGES

Leopold A. Harwood, Somerville, N.J., assignor to RCA Corporation, a corporation of Delaware Filed Nov. 29, 1965, Ser. No. 510,212
Int. Cl. H04b *1/16*
U.S. Cl. 325—405 7 Claims

ABSTRACT OF THE DISCLOSURE

Detector and automatic gain control (AGC) circuit stabilization is achieved in a direct coupled signal translating system by developing a control voltage which varies in response to undesirable power supply changes and by coupling this voltage to the detector and AGC circuits to maintain their operating biases substantially constant.

This invention relates to signal translating systems, in general, and to integrated circuit signal translating systems, in particular.

As used herein, the term integrated circuit refers to a unitary or monolithic semiconductor device or chip which is the equivalent of a network of interconnected active and passive circuit elements. Various problems have presented themselves in the design of such a semiconductor device. One problem, that of cascading resistance-capacitance coupled amplifiers, stems from the fact that an integrated circuit capacitor occupies a considerable area of the semiconductor chip, even for a relatively small amount of capacitance. Since the physical dimensions of the chip are limited, the size of the capacitor, and hence the amount of capacitance available for interstage coupling, must also be limited. Restricting the size of the capacitor, however, limits not only the low frequency response of the amplifier, but the high frequency response as well and, therefore, the gain at the desired signal frequency; and because of the parasitic shunt capacitance existing across the integrated circuit capacitor structure, the high frequency response of the amplifier will be limited still further. With the limitations in the processing techniques presently used for fabricating integrated circuit capacitors, these size restrictions may be a substantial source of trouble due to increased shorting between the plates of the capacitor. Consequently, it would be desirable to direct current (D.C.) couple amplifier stages in integrated circuit design wherever possible.

The cascading of known D.C. coupled amplifier stages, however, offers problems of its own. For example, since the D.C. voltage appearing at the output electrode of one stage comprises the input voltage for the next succeeding stage, complicated biasing networks are needed to establish the desired operating points for each of the cascaded stages. D.C. feedback is also generally necessary to maintain each operating point stable, and where substantial gain is to be effected in a single integrated circuit device, the phase shifts within the D.C. feedback loop are such as to increase the likelihood of circuit instability. Before D.C. coupled amplifier stages can be cascaded effectively in signal receiving systems employing detector and automatic gain control circuits, provision must be made to prevent the type of action afforded by these circuits from changing as the power supply voltage varies, otherwise, optimum recovery of the received signal information may be substantially impaired. Such changes may occur, for example, where the power supply voltage establishes the operating point of the detector circuit and where the automatic gain control circuit responds to the D.C. output signal of the detector.

It is an object of the present invention to provide an integrated circuit signal receiving system employing D.C. coupled amplifier stages in which apparatus is included to stabilize the operation of the detector and automatic gain control circuits thereof in the presence of power supply changes.

As will be explained hereinafter, such stabilization is achieved by developing a control voltage which varies in response to the power supply changes and by coupling this voltage to the detector and automatic gain control circuits to maintain the operating biases of these circuits substantially constant in the presence of such changes.

For a better understanding of the present invention, together with further objects thereof, reference is had to the following description, taken in connection with the accompanying drawing, and its scope will be pointed out in the appended claims.

Referring to the drawing, there is shown a schematic circuit diagram of an amplitude modulated radio receiver type of signal translating system illustrating the principles of the present invention. The rectangle 100 schematically represents a monolithic semiconductor integrated circuit chip and includes: (a) a transistor 102 adapted to be connected as part of a converter stage; (b) a three stage D.C. coupled intermediate frequency (IF) amplifier 104, 106, 108; (c) a bias supply circuit 110; (d) a detector stage 112 for developing an audio frequency signal and a signal used for automatic gain control (AGC) purposes; (e) an AGC amplifier stage 114; and (f) a current stabilizing circuit 116 connected to compensate for changes in the D.C. output voltage of the amplifier 104 brought about by AGC action. The chip 100 has a plurality of contact areas about its periphery, through which connections to the various circuits on the chip are made. As to physical dimensions, the size of the chip 100 may be 50 mils x 50 mils, or smaller.

Referring now more particularly to the drawing, the transistor 102 is connected as part of a converter stage, which also includes a ferrite antenna 118, a radio frequency (RF) tuning circuit 120, a tunable oscillator circuit 122 which is ganged to tune with the circuit 120, and an RF input circuit 124. The RF signals received, the oscillator signals developed, and a bias voltage produced at the junction of a pair of resistors 96 and 98 connected between a source of potential +E and ground are each coupled to the base electrode of the transistor 102 through a chip contact 126. The emitter electrode of the transistor 102 is connected to ground through a chip contact 128 and a parallel resistor-capacitor network 130, while the collector electrode is connected to an energizing potential terminal 132 through a chip contact 134, a winding of the oscillator circuit 122 and the primary winding of an IF transformer 136. The IF signal developed in the secondary winding of the transformer 136 is then coupled to the first D.C. coupled IF amplifier stage 104 through a chip contact 138.

The first IF amplifier stage 104 includes three transistors 140, 142 and 144 connected to comprise an emitter coupled amplifier driving a common collector amplifier, as is fully described in the pending application Ser. No.

396,140, filed Sept. 14, 1964 now Patent No. 3,366,889, and entitled "Signal Translating System." The IF signals present at the chip contact 138 are applied to the base electrode of transistor 140, are amplified by the transistors 140, 142 and 144, and are directly coupled to the second IF amplifier stage 106. The second IF amplifier stage 106 includes three transistors 146, 148 and 150, connected as in the first IF stage 104, and is directly coupled to the third IF amplifying stage 108, which also includes three similarly connected transistors 152, 154 and 156. The three cascaded stages 104, 106 and 108 comprise the IF amplifier portion of the AM receiver.

The amplified signal developed at the output of the third IF stage 108, i.e. at the emitter electrode of transistor 156, is directly coupled to the input of the detector stage 112. This stage includes a pair of transistors 158 and 160 connected in a "Darlington" type common collector configuration, with each transistor being biased to operate in its non-linear region, such as just below the knee of the current-voltage characteristic, to provide detector action. More particularly, transistors 158 and 160 operate in this condition to rectify and filter the signal from the IF stage 108, to produce a demodulated A.C. signal whose excursions represent the variations in the intensity of the received RF signals and a D.C. signal whose magnitude represents the sum of the output voltage of the detector stage 112 under zero signal conditions (hereafter, quiescent voltage) and the average value of the A.C. signal developed.

The A.C. output signal of the detector stage 112 (an audio frequency signal) is developed across an intermediate frequency bypass capacitor 162 connected between the emitter electrode of transistor 160 and ground by means of a chip contact 164. The signal is then coupled through a capacitor 166 to a volume control potentiometer 168, an audio amplifier 170 and appropriate loudspeaker apparatus 172, in that order, wherein it is amplified and reproduced.

The output signal of the detector stage 112 is integrated by a series resistor 174 and a shunt capacitor 175, and coupled to the AGC amplifier stage 114. This AGC stage 114 includes a pair of transistors 176 and 180 connected as an emitter coupled amplifier, with the base electrode of transistor 180 adapted to receive the integrated (D.C.) output signal from the detector stage 112. This transistor 180 develops a D.C. control voltage at its collector electrode which is a function of the intensity of the received RF signal. The control voltage (hereafter AGC signal) is then coupled to the base electrode of the transistor 140 in the first IF amplifier stage 104 through the chip contact 184, the secondary winding of the IF transformer 136 and the chip contact 138 to control the gain of that stage as a function of the signal intensity conditions.

The AGC signal developed by transistor 180 in the amplifier 114 is also directly coupled to the current stabilizing circuit 116. This circuit 116 also includes a pair of transistors 188 and 190 connected as an emitter coupled amplifier, with the base electrode of transistor 188 adapted to receive the control signal from the AGC amplifier stage 114. As is fully described in an application entitled "Signal Control Apparatus," Ser. No. 510,-226, and filed jointly with this application, any change in the D.C. current flowing through the load resistor 216 due to AGC action of the transistor 140 is offset by a substantially equal and opposite change in the D.C. current flowing from the transistor 188 in the current stabilizing circuit 116 through the load resistor 216 due to AGC action to that transistor. As a result, the D.C. voltage developed at the collector electrode of transistor 142 remains substantially constant and does not upset the operating biases of the following IF amplifier stages 106 and 108. However, because the AGC action is such as to change the collector currents of transistors 140 and 142, the gain of the first IF amplifier stage 104 is reduced and, consequently, the intensity of the signal delivered to the detector stage 112 is maintained substantially constant.

The bias circuit 110 is included on the semiconductor chip 100 to provide the necessary bias voltages for the IF amplifier stages 104, 106 and 108, for the AGC amplifier stage 114, and for the current stabilizer stage 116. The circuit 110 includes a pair of transistors 192 and 194 connected in a common emitter configuration and common collector configuration, respectively. The D.C. output voltage developed at the emitter electrode of transistor 194 is coupled through a resistor 196 to the base electrode of the transistor 154 included in the third IF amplifier stage 108 and, also, to the base electrode of the transistor 140 in the first IF stage 104 through the series connection containing a resistor 198, the chip contact 184, the secondary winding of the IF transformer 136 and the chip contact 138. The resistor 200 included in the collector circuit of transistor 192 is selected to be of substantially the same resistance value as the resistor 202 included in the emitter circuit of that transistor.

As is fully described in an application, Ser. No. 510,307, now U.S. Patent No. 3,383,612, entitled "Integrated Circuit Biasing Arrangement," and filed concurrently with this application, with resistors 200 and 202 proportioned in this manner, the D.C. output voltage developed at the emitter electrode of transistor 194 is equal to one-half the voltage of the power supply connected between an energizing potential contact 204 and a reference potential contact 206, the latter contact 206 being connected to ground. By selecting resistors 196 and 198 to be of the same resistance value, the bias potentials applied to the base electrode of the transistor 140 in the first IF amplifier stage 104 and to the base electrode of the transistor 154 in the third IF amplifier stage 108, respectively will each be equal. To maintain symmetrical operation of the three IF stages 104, 106 and 108, a D.C. voltage developed at the emitter electrode of the transistor 156 in the stage 108 is fed back to the base electrode of the transistor 148 in the stage 106 through a resistor 208, and, further, through a resistor 210 to the base electrode of the transistor 142 in the stage 104. This symmetrical operation is achieved by selecting resistor 208 to be of substantially the same resistance value as the resistor 210, and with both being equal in resistance to the resistors 196 and 198. The feedback arrangement is such that under zero signal conditions, equal bias potentials are applied to the base electrodes of both transistors of the emitter coupled amplifier of each of the IF stages 104, 106 and 108.

Conductors 212 and 214, respectively, connect the energizing potential contact 204 and the reference potential contact 206 to the various stages on the semiconductor chip 100 to provide the necessary operating voltage for those stages.

It would be advantageous to consider at this point the operation of the detector stage 112 and the AGC amplifier stage 114 where the detector stage is referenced to ground potential. Such would be the case, for example, where the resistor 218 is connected between the emitter electrode of transistor 160 and ground via the dashed conductor 220. It will be noted that the signal coupled to the base electrode of transistor 158 comprises an A.C. component indicative of intensity variations of the received RF signals and a D.C. component indicative of the quiescent voltage developed at the emitter electrode of the transistor 156. It will also be noted that that quiescent D.C. component is substantially equal to the bias potential applied to the base electrode of transistor 154, because the D.C. voltage at the collector electrode of transistor 154 is one $V_{be}$ higher (more positive) than the D.C. voltage at its base electrode while the D.C. voltage at the emitter electrode of transistor 156 is one $V_{be}$ lower (more negative) than the D.C. voltage at its base electrode and because the collector electrode of transistor 154 is directly connected to the base electrode of transistor 156. (As used herein, the term $V_{be}$ voltage represents both the average base-to-emitter and collector-to-base voltages of a transistor which is operating as the active device in an amplifier circuit or the like. For silicon transistors, these two voltages are approximately 0.7 volt each, which is within the range required for Class A amplification. Since transistors 154 and 156 are each included in the monolithic integrated circuit chip 100, they are composed of the same semiconductor material so that their respective $V_{be}$ voltages are equal.)

Assume, now, that the power supply voltage changes by an amount $\Delta e$. The potential developed by the bias circuit 110 at the emitter electrode of transistor 194 will also change but, in accordance with the principles of U.S. Patent No. 3,383,612, by an amount equal to $\Delta e/2$. Such a change in potential will cause a $\Delta e/2$ change at the base electrode of transistor 154, a corresponding $\Delta e/2$ change in the D.C. component of the signal developed at the emitter electrode of transistor 156 and, consequently, a shift in the operating point of the detector stage transistors 158 and 160. If this shift is sufficiently great, signal detection will be impaired and inaccurate recovery of the received RF signal information will result. But regardless of its extent, the effect of this shift will be to change the D.C. output voltage of the detector stage (more particularly, of the transistor 160) and, because of the resistive connection between the emitter electrode of transistor 160 and the base electrode of transistor 180, the effect will also be to change the operating point of the AGC amplifier 114. Such a power supply variation may therefore produce deleterious AGC action changes as well.

The signal translating system of the invention, however, includes control apparatus for stabilizing the operation of the circuits 112 and 114 in the presence of such changes. First, resistor 218 is connected between the emitter electrode of transistor 160 and junction of the emitter electrodes of transistors 176 and 180 via the conductor 222. Second, the base electrode of transistor 176 is directly connected to the emitter electrode of transistor 192 by means of the conductor 224; alternatively, it may be connected by means of the dashed conductor 226 to the junction of the emitter electrodes of transistors 188 and 190 instead.

Assuming the first of the two alternative connections to be made, a $\Delta e$ change in the power supply voltage has the following effects. As was previously mentioned, the D.C. potential developed at the emitter electrode of transistor 194 and at the emitter electrode of transistor 156 changes by $\Delta e/2$. This $\Delta e/2$ D.C. change at the emitter electrode of transistor 194 is translated essentially unchanged through the base-emitter junction of transistors 192, the conductor 224, the base-emitter junction of transistor 176, the conductor 222 and the resistor 218 to the emitter electrode of transistor 160. The D.C. voltage at the emitter electrode of transistor 160 is thereby made to track the D.C. voltage at the base electrode of transistor 158, with the result that a constant bias voltage is maintained across the series base-emitter circuits of the detector stage transistors 158 and 160.

A similar situation exists with the second of the two alternative connections. Here, however, the $\Delta e/2$ D.C. voltage change developed at the emitter electrode of transistor 194 is translated essentially unchanged to the emitter electrode of transistor 160 through the resistor 228 (of substantially the same resistance value as the resistor 198) to the base electrode of transistor 190, and through the base-emitter junction of transistor 190, the conductor 226, the base-emitter junction of transistor 176, the conductor 222 and the resistor 218.

By referencing the detector stage 112 to a potential which varies with power supply changes in this manner, the operating points of the detector stage transistors 158 and 160 are fixed and, moreover, are fixed within their non-linear regions. As a result, the detector action provided by the stage 112 is stabilized in the presence of the above-mentioned changes.

Furthermore, the $\Delta e/2$ D.C. voltage change at the emitter electrode of transistor 160 is also coupled essentially unchanged through resistor 174 to the base electrode of transistor 180. The D.C. voltage at the base electrode of transistor 180 is thereby made to track the D.C. voltage at the emitter electrode of that transistor, so as to maintain a fixed bias across the AGC amplifier 114 as the power supply varies. The result, here too, is a stabilization of the AGC action provided in the presence of such variations.

It will be noted from the drawing that a $2V_{be}$ difference in potential exists between the emitter electrode of transistor 156 and the junction of the emitter electrodes of transistors 176 and 180—a first $V_{be}$ difference associated with the transistor 176 and a second $V_{be}$ difference associated with either transistor 192 or 190, depending upon which of the two alternate connections to the base electrode of transistor 176 are used. The value of resistor 218 is selected to produce a voltage drop of sufficient magnitude to bring transistors 158 and 160 within the non-linear portion of their operating characteristics. In one embodiment of the invention, resistor 218 was selected to provide a voltage drop in the order of 0.3 volt, so as to establish a potential difference of approximately 1.1 volts between the base electrode of transistor 158 and the emitter electrode of transistor 160, or approximately 0.55 volt across the base-emitter junctions of each. Such a potential difference causes transistors 158 and 160 to conduct slightly and is within the range needed to operate these silicon transistors in a manner to provide detector type action. (The value of resistor 218, when chosen in this way, turns out to be many times greater than the effective resistance at the junction of the emitter electrodes of transistors 176 and 180. Because of this, no bypass capacitor need be coupled to the junction to prevent the audio frequency signal existing at the emitter electrode of the detector transistor 160 from affecting the AGC performance.)

In the absence of any received RF signals, the D.C. voltage existing at the collector electrode of transistor 180 is essentially equal to one-half the power supply potential, the D.C. voltage at the emitter electrode is $2V_{be}$ voltages lower (more negative) than that potential, and the D.C. voltage at the base electrode is 0.3 volt greater (more positive) than the D.C. voltage at the emitter electrode. Under such zero signal conditions, transistor 180 in the AGC amplifier stage 114 will be effectively cut-off. Transistor 180 will remain cut-off under signal conditions until the D.C. component of the detected signal at the emitter electrode of transistor 160 is sufficient in magnitude to raise the D.C. voltage at the base electrode of transistor 180 to a point at which transistor 180 will conduct. That, and any further, increase in the D.C. component of the detected signal will produce a drop or decrease in the D.C. voltage at the collector electrode of transistor 180 (i.e. an AGC signal) which will be equally translated to the base electrode of transistor 140 in the first IF stage 104 and to the base electrode of transistor 188 in the current stabilizing circuit 116.

In the IF stage 104, the more negative D.C. voltage at the base electrode of transistor 140 reduces current flow through resistor 230, increases the bias on transistor 142, and increases the D.C. current flow from transistor 142 through resistor 216. With the transistor 142 initially biased at an operating point such that an increase in its D.C. current reduces its transconductance, it will be noted that the effect of the AGC action is to decrease the gain of the stage 104, as desired.

In the current stabilizing circuit 116, the decrease in D.C. voltage at the base electrode of transistor 188 reduces the D.C. current that flows from that transistor through the resistor 216. Since essentially equal AGC signals are translated to the transistor 140 and 188, the decrease in current in transistor 188 can be made effectively equal to the increase in current in transistor 142 by selecting resistor 232 in the stage 116 to equal resistor 230 in the IF stage 104. Thus, a constant D.C. current can be made to flow through the resistor 216, so as to offset any changes that AGC action might otherwise impose on the operating point biases of the further IF stages 106 and 108. As was previously mentioned, this operation is more fully described in the Ser. No. 510,226 application.

What is claimed is:

1. A signal translating system adapted to be energized by a source of unidirectional potential comprising:

amplifier means operative to provide signal modulated carrier waves including a direct current component which undesirably varies with changes in said unidirectional potential;

a detector circuit direct current coupled to said means for developing demodulated output signals representative of the modulation components of said provided carrier waves;

utilization means coupled to receive said demodulated output signals;

an automatic gain control circuit direct current coupled to said detector circuit for developing control voltages indicative of the strength of said modulated carrier waves;

means coupling said control voltages to said amplifier means for controlling the gain thereof to stabilize the amplitude of said demodulated output signals;

and means responsive to said changes in unidirectional potential for applying a variable voltage to said detector circuit and to said gain control circuit for stabilizing their operating points in the presence of said undesirable direct current component variations.

2. A signal translating system as defined in claim 1 wherein said detector circuit includes an output terminal and a pair of input terminals, one of said input terminals being direct current coupled to said amplifier means and the other of said input terminals being coupled to said operating point stabilizing means, and wherein the variable voltage applied to said other input terminal varies in substantially the same amount and in the same polarity as the variations of said direct current component.

3. A signal translating system as defined in claim 2 wherein said detector circuit also includes at least one transistor having a base electrode coupled to said one input terminal, an emitter electrode coupled to said other input terminal, and a collector electrode coupled to said unidirectional potential source.

4. A signal translating system as defined in claim 2 wherein said detector circuit also includes a first transistor having a base electrode direct current coupled to said one input terminal, an emitter electrode, and a collector electrode direct current coupled to said unidirectional potential source and wherein said circuit additionally includes a second transistor having a base electrode direct current coupled to the emitter electrode of said first transistor, an emitter electrode direct current coupled to said other input terminal, and a collector electrode direct current coupled to said potential source.

5. A signal translating system as defined in claim 3 wherein said operating point stabilizing means includes a transistor having a collector electrode direct current coupled to said unidirectional potential source, an emitter electrode coupled to said other input terminal of said detector circuit, and a base electrode direct current coupled to a second source of unidirectional potential and wherein said second source supplies a voltage $(N-1)V_{be}$ volts less than said direct current component under zero signal conditions, where N represents the number of transistors within said detector circuit and $V_{be}$ represents the average base-to-emitter voltage drop of said transistor when operating as the active device in an amplifier circuit.

6. A signal translating system as defined in claim 2 wherein said automatic gain control circuit includes a pair of input terminals, one of said control circuit input terminals being direct current coupled to said detector circuit output terminal and the other of said control circuit input terminals being coupled to said operating point stabilizing means, and wherein the variable voltage applied to said other control circuit input terminal varies in substantially the same amount and in the same polarity as the variable voltage applied to said detector circuit.

7. A signal translating circuit comprising:

first, second, third, and fourth potential terminals;

first, second, third, fourth, fifth, sixth and seventh transistors, each having a collector electrode, a base electrode and an emitter electrode;

direct current connections from the collector electrodes of said first, third, fourth, fifth, and sixth transistors to said first terminal;

direct current connections from the collector electrode of said second transistor to the base electrode of said third transistor, from the emitter electrode of said third transistor to the base electrode of said fourth transistor, and from the emitter electrode of said fourth transistor to the base electrode of said fifth transistor;

a direct current connection from the base electrode of said sixth transistor to said third terminal;

a first resistor connected between the emitter electrodes of said first and second transistors and said second terminal;

a second resistor connected between the collector electrode of said second transistor and said first terminal;

a third resistor connected between the emitter electrode of said third transistor and said second terminal;

a fourth resistor connected between the emitter electrodes of said sixth and seventh transistors and said second terminal;

a fifth resistor connected between the emitter electrode of said sixth transistor and the emitter electrode of said fifth transistor;

a sixth resistor connected between the base electrode of said second transistor and said fourth terminal;

a seventh resistor connected between the collector electrode of said seventh transistor and said fourth potential terminal;

an eighth resistor connected between the base electrode of said seventh transistor and the emitter electrode of said fifth transistor;

utilization means coupled to the emitter electrode of said fifth transistor;

means for applying an energizing potential to said first terminal;

means for applying a reference potential to said second terminal;

means for applying a potential to said third terminal substantially equal to one-half the voltage of said energizing potential less the base-to-emitter voltage drop of one of said fourth and fifth transistors when operating as the active device in an amplifier circuit;

means for applying a potential to said fourth terminal substantially equal to one-half the voltage of said energizing potential;

and means for supplying input signals to be translated to the base electrode of said first transistor, said signals having an alternating current component superimposed upon a direct current component of substantially the same voltage as exists at the base electrode of said second transistor.

(References on following page)

References Cited

UNITED STATES PATENTS

| | | | |
|---|---|---|---|
| 2,037,456 | 4/1936 | Burnside | 325—400 |
| 2,601,271 | 6/1952 | French | 330—128 |
| 2,620,406 | 12/1952 | Nelson | 330—128 |
| 2,929,998 | 3/1960 | Diehl | 330—22 |
| 2,949,543 | 8/1960 | Nordahl | 307—315 |
| 3,199,029 | 8/1965 | Laurent | 325—400 |
| 3,241,082 | 3/1966 | Litgen | 330—19 |
| 3,344,355 | 9/1967 | Massman | 325—405 |

KATHLEEN, H. CLAFFY, Primary Examiner

R. S. BELL, Assistant Examiner

U.S. Cl. X.R.

325—408; 330—19, 25